(12) United States Patent
Iso et al.

(10) Patent No.: US 10,224,201 B2
(45) Date of Patent: Mar. 5, 2019

(54) C-PLANE GAN SUBSTRATE

(71) Applicant: MITSUBISHI CHEMICAL CORPORATION, Tokyo (JP)

(72) Inventors: Kenji Iso, Tokyo (JP); Yuuki Enatsu, Tokyo (JP); Hiromitsu Kimura, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 15/675,230

(22) Filed: Aug. 11, 2017

(65) Prior Publication Data

US 2017/0338112 A1 Nov. 23, 2017

Related U.S. Application Data

(63) Continuation of application No. PCT/JP2016/054539, filed on Feb. 17, 2016.

(30) Foreign Application Priority Data

Feb. 23, 2015 (JP) .................................. 2015-032949

(51) Int. Cl.
*H01L 21/20* (2006.01)
*H01L 21/02* (2006.01)
(Continued)

(52) U.S. Cl.
CPC ........ *H01L 21/02389* (2013.01); *C30B 25/04* (2013.01); *C30B 25/18* (2013.01);
(Continued)

(58) Field of Classification Search
CPC ....... H01L 33/22; H01L 33/16; H01L 33/007; H01L 33/32; H01L 33/06; H01L 2933/0058
(Continued)

(56) References Cited

U.S. PATENT DOCUMENTS 6,348,096 B1  2/2002  Sunakawa et al.
7,772,585 B2 *  8/2010  Uematsu ................. C30B 25/18
                                                              117/87

(Continued)

FOREIGN PATENT DOCUMENTS

JP           10-312971 A    11/1998
JP         2005-522890 A     7/2005
(Continued)

OTHER PUBLICATIONS

J. W. P. Hsu, et al., "Direct imaging of reverse-bias leakage through pure screw dislocations in GaN films grown by molecular beam epitaxy on GaN templates" *Applied Physics Letters*, Jul. 1, 2002, pp. 79-51, vol. 81.

(Continued)

*Primary Examiner* — Vu A Vu
(74) *Attorney, Agent, or Firm* — Leason Ellis LLP (57) ABSTRACT

Provides is a C-plane GaN substrate which, although formed from a GaN crystal grown so that surface pits are generated, is free from any inversion domain, and moreover, has a low spiral dislocation density in a gallium polar surface. Provides is a C-plane GaN substrate wherein: the substrate comprises a plurality of facet growth areas each having a closed ring outline-shape on a gallium polar surface; the spiral dislocation density is less than $1 \times 10^6$ cm$^{-2}$ anywhere on the gallium polar surface; and the substrate is free from any inversion domain. The C-plane GaN substrate may comprise a high dislocation density part having a dislocation density of more than $1 \times 10^7$ cm$^{-2}$ and a low dislocation density part having a dislocation density of less than $1 \times 10^6$ cm$^{-2}$ on the gallium polar surface.

20 Claims, 7 Drawing Sheets

(51) Int. Cl.
  *C30B 25/04* (2006.01)
  *C30B 25/18* (2006.01)
  *C30B 29/40* (2006.01)

(52) U.S. Cl.
  CPC ........ *C30B 29/406* (2013.01); *H01L 21/0254* (2013.01); *H01L 21/0257* (2013.01); *H01L 21/0262* (2013.01); *H01L 21/02576* (2013.01); *H01L 21/02609* (2013.01); *H01L 21/02647* (2013.01)

(58) Field of Classification Search
  USPC ........................................................ 438/479
  See application file for complete search history.

(56) References Cited

U.S. PATENT DOCUMENTS

| | | | |
|---|---|---|---|
| 7,800,126 B2* | 9/2010 | Yamamoto | H01L 33/0079 257/103 |
| 2006/0099781 A1 | 5/2006 | Beaumont et al. | |
| 2009/0140287 A1 | 6/2009 | Fujiwara et al. | |
| 2011/0201184 A1* | 8/2011 | Motoki | C23C 16/303 438/492 |

FOREIGN PATENT DOCUMENTS

| | | |
|---|---|---|
| JP | 2005-534182 A | 11/2005 |
| JP | 2006-066496 A | 3/2006 |
| JP | 2009-132575 A | 6/2009 |
| JP | 2010-070430 A | 4/2010 |
| WO | WO-03/089696 A1 | 10/2003 |

OTHER PUBLICATIONS

B. S. Simpkins, et al., "Correlated scanning Kelvin probe and conductive atomic force microscopy studies of dislocations in gallium nitride", *Journal of Applied Physics*, Aug. 1, 2003, pp. 1448-1453, vol. 94.

International Search Report dated May 17, 2016 for the corresponding PCT Application No. PCT/JP2016/054539.

J. W. P. Hsu, et al., "Direct imaging of reverse-bias leakage through pure screw dislocations in GaN films grown by molecular beam epitaxy on GaN templates" *Applied Physics Letters*, Jul. 1, 2002, pp. 79-81, vol. 81.

International Preliminary Report on Patentability dated Sep. 8, 2017 for the corresponding PCT Application No. PCT/JP2016/054539.

* cited by examiner

C-PLANE GaN SUBSTRATE

CROSS-REFERENCE TO RELATED APPLICATION

This is a continuation of International Application PCT/JP2016/054539, filed on Feb. 17, 2016, which designated the U.S., and claims priority from Japanese Patent Application 2015-032949 which was filed on Feb. 23, 2015, the entire contents of which are incorporated herein by reference.

TECHNICAL FIELD

The present invention mainly relates to a C-plane GaN substrate.

BACKGROUND ART

GaN (gallium nitride) is one of Group III-V compound semiconductors and has a wurtzite-type crystal structure belonging to a hexagonal crystal system.

In recent years, a GaN substrate being a single crystal substrate formed of only a GaN crystal has attracted attention as a substrate for a nitride semiconductor device.

A nitride semiconductor is also called a "III-nitride based compound semiconductor", "nitride-based Group III-V compound semiconductor", "GaN-based semiconductor" or the like, and includes, besides GaN, a compound where gallium in GaN is partially or fully substituted with other Group 13 elements (B, Al, In, or the like) in the periodic table.

One particularly useful GaN substrate is a C-plane GaN substrate having a main surface parallel to or substantially parallel to the C-plane.

The C-plane GaN substrate has a gallium polar surface being a main surface on the [0001] side and a nitrogen polar surface being a main surface on the [000-1] side. The gallium polar surface is currently mainly used for formation of nitride semiconductor devices.

A GaN crystal grown by an HVPE (Hydride Vapor Phase Epitaxy) method is used for a C-plane GaN substrate commercially produced.

A seed used in the growth of a GaN crystal by an HVPE method is a GaN template having a c-axis-oriented GaN film grown on a single crystal substrate different in composition from GaN, such as a sapphire substrate or a GaAs substrate, by an MOVPE (Metal Organic Vapor Phase Epitaxy) method. A GaN crystal is grown on the GaN template in the c-axis direction.

Various procedures are proposed in order to reduce the dislocation density of a GaN crystal grown by an HVPE method.

In a typical example, a growth mask for allowing ELO (Epitaxial Lateral Overgrowth) to occur is provided on a main surface of a seed substrate (Patent Document 1). According to this method, when crystals growing in a lateral direction mutually coalesce, a dislocation loop is formed to result in the disappearance of a dislocation.

JP-A-2006-66496 (Patent Document 2) discloses a method of generating a surface pit with an inversion domain (a domain where the polarity of a crystal is locally inverted) on a GaN crystal. While the growth direction of the GaN crystal is the [0001] direction (+c direction) in any regions other than the inversion domains, it is the [000-1] direction (-c direction) in the inversion domains. It is mentioned that dislocation defects aggregating towards the surface pits are confined in the inversion domains.

One index for measuring performances and reliability of semiconductor devices is a current leakage in reverse bias. A device with less leakage is more excellent in reliability. With respect to a Group III nitride semiconductor device in which the main part of a device structure is formed with a Group III nitride semiconductor crystal, it is mentioned that a main crystal defect causing a current leakage in reverse bias corresponds to a spiral dislocation (Non-Patent Literature 1 and Non-Patent Literature 2). The term "spiral dislocation" here refers to a pure spiral dislocation, and does not include a mixed dislocation (containing a spiral component and an edge component).

PRIOR ART DOCUMENT

Patent Document

Patent Document 1: JP-A-10-312971
Patent Document 2: JP-A-2006-66496

Non-Patent Literature

Non-Patent Literature 1: J. W. Hsu, et al., Applied Physics Letters, Vol. 81, pp. 79-81 (2002)
Non-Patent Literature 2: B. S. Simpkins, et al., Journal of Applied Physics, Vol. 94, pp. 1448-1453 (2003)

SUMMARY OF THE INVENTION

Problem to be Solved by Invention

A GaN substrate is mainly used as a substrate for a Group III nitride semiconductor device. It is considered that the spiral dislocation density on a main surface of a GaN substrate for use in a base material is desirably low in order to form a Group III nitride semiconductor device excellent in reliability. The reason for this is that dislocation defects present in the main surface of the GaN substrate is inherited by a Group III nitride semiconductor crystal epitaxially grown thereon.

The GaN crystal having dislocations reduced by an ELO method, disclosed in Patent Document 1 (JP-A-10-312971) described above, has a problem of being difficult to process. While the detail reason is not clear, a GaN crystal grown so that the surface during its growth is a flat surface parallel to the C-plane is easily cracked when processed, for example, ground and/or sliced. Such a tendency is more remarkable for a Si (silicon) doped GaN.

The C-plane GaN substrate produced from a GaN crystal having inversion domains, disclosed in Patent Document 2 (JP-A-2006-66496) described above, has a disadvantage of being incapable of allowing a semiconductor device to be formed on the inversion domains. In other words, a nitride semiconductor device formed on such a C-plane GaN substrate is strongly restricted in terms of the shape and the dimension thereof.

The present invention has been made in view of the above circumstances, and a main object thereof is to provide a C-plane GaN substrate which, although formed from a GaN crystal grown so that surface pits are generated, is free from any inversion domain, and moreover, has a low spiral dislocation density in a gallium polar surface. The term "spiral dislocation" here refers to a pure spiral dislocation including no mixed dislocation, and much the same is true in the following descriptions, unless particularly noted.

Means for Solving the Problem

Aspects of the present invention include a C-plane GaN substrate, a method for producing a nitride semiconductor device, and an epitaxial wafer, described below.

[1] A C-plane GaN substrate wherein: the substrate comprises a plurality of facet growth areas each having a closed ring outline-shape on a gallium polar surface; the spiral dislocation density is less than $1 \times 10^6$ cm$^{-2}$ anywhere on the gallium polar surface; and the substrate is free from any inversion domain.
[2] The C-plane GaN substrate according to [1], wherein the spiral dislocation density is less than $8 \times 10^5$ cm$^{-2}$ anywhere on the gallium polar surface.
[3] The C-plane GaN substrate according to [1] or [2], wherein the substrate comprises a high dislocation density part having a dislocation density of more than $1 \times 10^7$ cm$^{-2}$ and a low dislocation density part having a dislocation density of less than $1 \times 10^6$ cm$^{-2}$ on the gallium polar surface.
[4] The C-plane GaN substrate according to [3], wherein, when the entire gallium polar surface is comparted into 100 μm-square compartments, 1% or more of all the compartments each have a dislocation density of less than $1 \times 10^5$ cm$^{-2}$.
[5] The C-plane GaN substrate according to any one of [1] to [4], wherein the substrate is doped with oxygen.
[6] The C-plane GaN substrate according to any one of [1] to [5], wherein the substrate is doped with either or both of silicon and germanium.
[7] The C-plane GaN substrate according to any of [1] to [6], wherein the substrate comprises a GaN crystal grown by use of a seed with dot masks arranged on the surface of the seed.
[8] A method for producing a nitride semiconductor device, including a step of preparing the C-plane GaN substrate according to any one of [1] to [7], and a step of epitaxially growing at least one nitride semiconductor layer on the prepared C-plane GaN substrate.
[9] An epitaxial wafer including the C-plane GaN substrate according to any one of [1] to [7], and at least one nitride semiconductor layer disposed on the C-plane GaN substrate.
[10] A C-plane GaN substrate having a gallium polar surface, wherein:
the substrate comprises a plurality of facet growth areas each having a closed ring outline-shape on the gallium polar surface;
when a virtual square grid of 2 cm×2 cm is drawn on the gallium polar surface, each cell of the grid comprises at least one 1 cm×1 cm square area in which a spiral dislocation density is anywhere less than $1 \times 10^6$ cm$^{-2}$; and the substrate is free from any inversion domain.
[11] The C-plane GaN substrate according to [10], wherein each cell of the grid comprises at least one 1 cm×1 cm square area in which a spiral dislocation density is anywhere less than $8 \times 10^5$ cm$^{-2}$.
[12] The C-plane GaN substrate according to [10] or [11], wherein the substrate comprises a high dislocation density part having a dislocation density of more than $1 \times 10^7$ cm$^{-2}$ and a low dislocation density part having a dislocation density of less than $1 \times 10^6$ cm$^{-2}$ on the gallium polar surface.
[13] The C-plane GaN substrate according to [12], wherein, when the entire gallium polar surface is comparted into compartments of 100 μm-square, 1% or more of all the compartments each have a dislocation density of less than $1 \times 10^5$ cm$^{-2}$.
[14] The C-plane GaN substrate according to any one of [10] to [13], wherein the substrate is doped with oxygen.
[15] The C-plane GaN substrate according to any one of [10] to [14], wherein the substrate is doped with either or both of silicon and germanium.
[16] The C-plane GaN substrate according to any one of [10] to [15], wherein the substrate comprises a GaN crystal grown by use of a seed with dot masks arranged on the surface of the seed.
[17] A method for producing a nitride semiconductor device, including a step of preparing the C-plane GaN substrate according to any one of [10] to [16], and a step of epitaxially growing at least one nitride semiconductor layer on the prepared C-plane GaN substrate.
[18] An epitaxial wafer including the C-plane GaN substrate according to any one of [10] to [16], and at least one nitride semiconductor layer disposed on the C-plane GaN substrate.

Effect of the Invention

The present invention provides a C-plane GaN substrate which, although formed from a GaN crystal grown so that surface pits are generated, is free from any inversion domain, and moreover, has a low spiral dislocation density on a gallium polar surface.

DESCRIPTION OF EMBODIMENTS

Figure 1A:
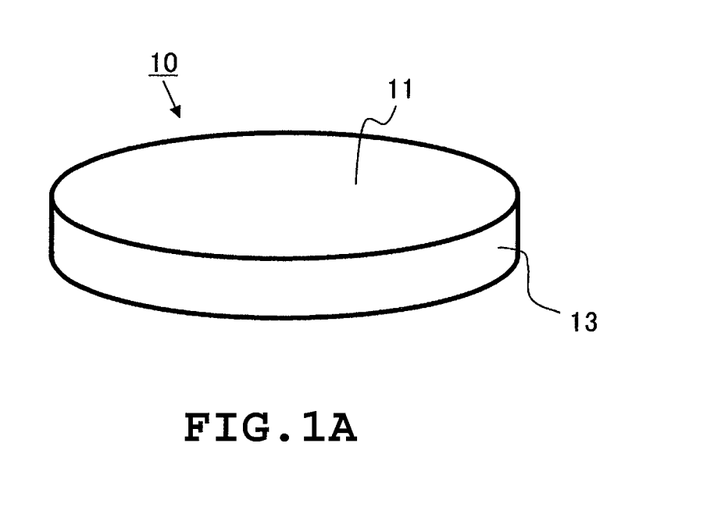
FIGS. 1A and 1B are drawings illustrating one example of a C-plane GaN substrate of the present invention, with FIG. 1A being a perspective view, and FIG. 1B being a side view.
Figure 1B:
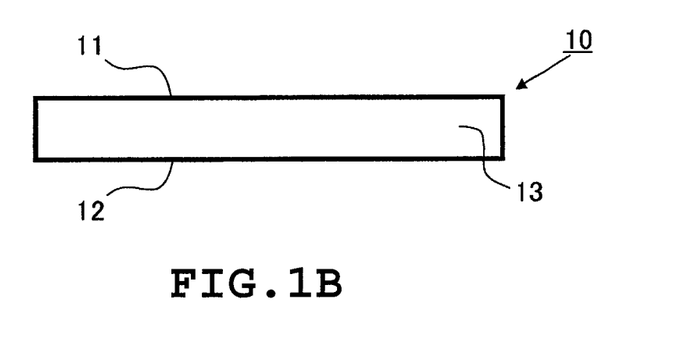

In a GaN crystal, a crystal axis parallel to [0001] is called a "c-axis", a crystal axis parallel to <10-10> is called an "m-axis", and a crystal axis parallel to <11-20> is called an "a-axis". In addition, a crystal plane perpendicular to the c-axis is called a "C-plane", a crystal plane perpendicular to the m-axis is called an "M-plane", and a crystal plane perpendicular to the a-axis is called an "A-plane".
Herein, references to a crystal axis, a crystal plane, a crystal orientation, and the like mean references to a crystal axis, a crystal plane, a crystal orientation, and the like of a GaN crystal, respectively, unless otherwise noted.
Hereinafter, the present invention will be described in detail with reference to specific embodiments.
1. C-Plane GaN Substrate
The C-plane GaN substrate of the present invention typically has a disk shape as illustrated in FIGS. 1A and 1B. FIG. 1A is a perspective view and FIG. 1B is a side view.
With reference to FIGS. 1A and 1B, a C-plane GaN substrate 10 has a gallium polar surface 11 which is a main surface on the [0001] side, a nitrogen polar surface 12 which is a main surface on the [000-1] side, and a side surface 13.

The diameter of the C-plane GaN substrate 10 is 45 mm or more, usually 305 mm or less.

Typical diameters include 45 to 55 mm (about 2 inches), 95 to 105 mm (about 4 inches), 145 to 155 mm (about 6 inches), and 195 to 205 mm (about 8 inches).

The C-plane GaN substrate is required to have a strength so that any disadvantage is not caused in handling, and the thickness thereof is thus preferably 250 µm or more, more preferably 300 µm or more. It can also be made thicker depending on the diameter.

Beveling for smoothing the boundary between the gallium polar surface 11 and the side surface 13 may be appropriately performed, if necessary. Much the same is true on the boundary between the nitrogen polar surface 12 and the side surface 13.

The C-plane GaN substrate 10 may be further provided with not only an orientation flat representing a crystal orientation, but also a marking such as an index flat in order to facilitate identification of the gallium polar surface 11 and the nitrogen polar surface 12.

While the main surfaces of the C-plane GaN substrate 10 may be parallel to the C-plane of a GaN crystal, these may be preferably slightly tilted from the C-plane. The angle of such tilt is referred to as the "off-angle".

When the gallium polar surface is tilted from the (0001) plane, a preferable tilt direction is a direction within a range of ±5° relative to the <10-10> direction, or a direction within a range of ±5° relative to the <11-20> direction. The absolute value of the off-angle is usually 0.1 degrees or more, preferably 0.2 degrees or more, and is usually 10 degrees or less, preferably 2 degrees or less, more preferably 1 degree or less.

In the C-plane GaN substrate of the present invention, a plurality of facet growth areas each having a closed ring outline-shape are observed in a gallium polar surface.

Figure 2A:
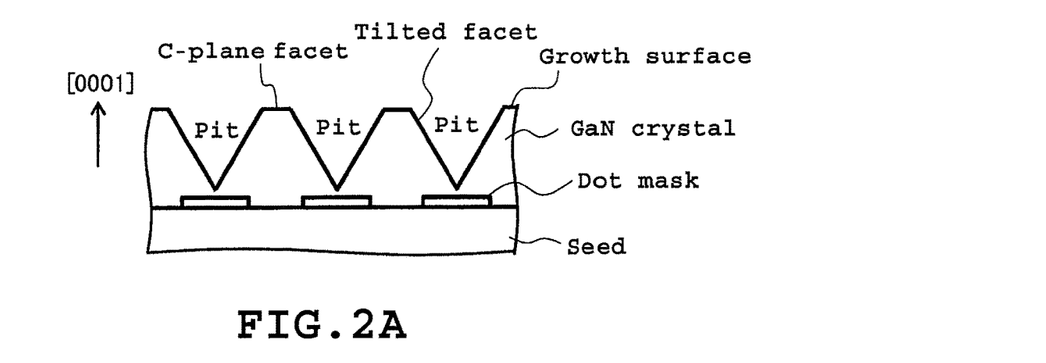
FIGS. 2A to 2C are drawings describing how facet growth areas are formed.

The definition of the facet growth areas and how the facet growth areas are formed are described with reference to FIGS. 2A to 2C.

A GaN crystal forming the C-plane GaN substrate of the present invention is produced by growing GaN on a seed in the c-axis direction. The surface of the seed is provided with dot masks, and the dot masks act to allow pits to be generated on the growth surface of a GaN crystal (the surface of a GaN crystal during growth) at the initial stage of growth, as illustrated in FIG. 2A.

Tilted facets which are facets other than C-plane facets are exposed in the pits. The tilted facets are tilted relative to the C-plane. Examples of the tilted facets include, but are not limited to, {n n −2n k} facets such as {11-22} facets and {11-21} facets, and {n 0 −n k} facets such as {10-11} facets and {10-12} facets (where n and k each represent an integer).

Facets exposed to areas other than the pits are C-plane facets.

Figure 2B:
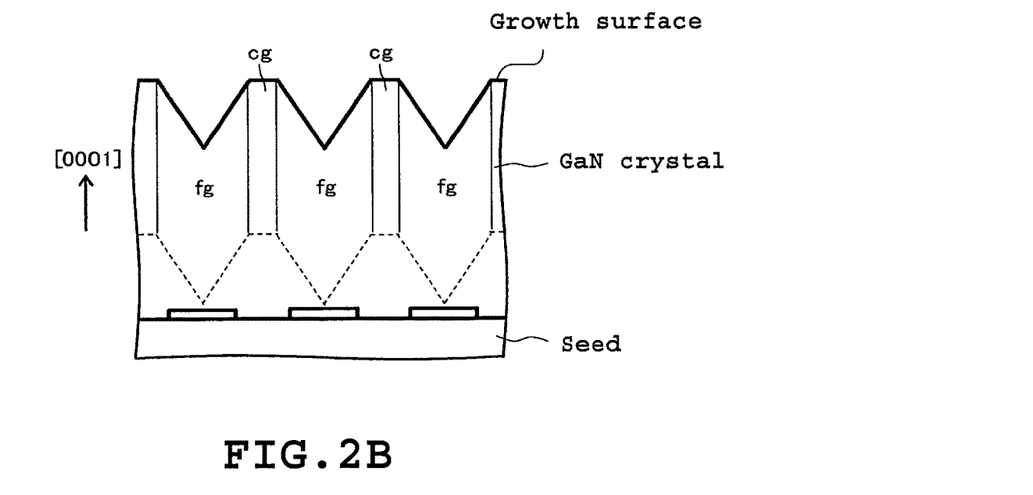

When a GaN crystal is grown with pits kept present on the growth surface, the formed GaN crystal comprises facet growth portions fg and C-plane growth portions cg as illustrated in FIG. 2B. The facet growth portion fg corresponds to a portion formed through growth on the tilted facet, and the C-plane growth portion cg corresponds to a portion formed through growth on the C-plane facet.

It is noted that, when a GaN crystal actually grows, the dimensions of the pits are not constant as illustrated in FIG. 2B and may be varied. Some pits may become larger and some pits may become smaller as a GaN crystal grows, probably due to the difference in local environment.

Figure 2C:
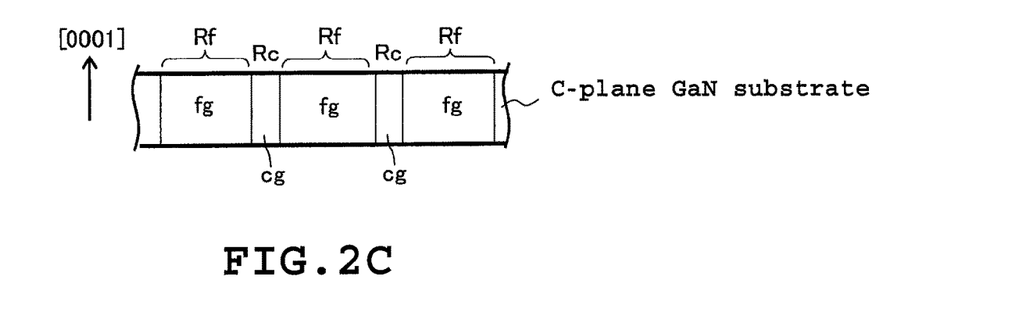

When the GaN crystal comprising the facet growth portions fg and the C-plane growth portions cg is processed, a C-plane substrate having facet growth areas Rf and C-plane growth areas Rc on a main surface thereof is obtained as illustrated in FIG. 2C. The facet growth area Rf corresponds to an area where the facet growth portion fg is exposed and the C-plane growth area Rc corresponds to an area where the C-plane growth portion cg is exposed. The facet growth portions fg and the C-plane growth portions cg are exposed to both of the gallium polar surface and the nitrogen polar surface.

As can be understood from the formation mechanism described above, the outline of the facet growth area has a closed ring shape in a reflection of the shape of the pit formed on the growth surface of the GaN crystal. While many of the facet growth areas Rf have an outline shape close to a circle, some may have a deformative shape, for example, in portions where coalescence or the like between the pits has occurred during crystal growth.

The present inventors have found that a GaN crystal grown so that dot masks are provided on the surface of a seed to form facet growth portions hardly causes cracking and can also sufficiently withstand processing such as grinding and slicing as compared with a GaN crystal formed only from C-plane growth portions.

While no detail reason for this is clear, a dislocation group arises when a GaN crystal is grown so that a pit is generated over the dot mask, and as a result, the stress may be relaxed. According to the observation by the present inventors, the dislocation group arises in the immediate vicinity of the dot mask, and the scale of the arising dislocation group tends to be smaller when the dimension of the dot mask is made smaller.

All of the plurality of facet growth areas observed on the main surface of the C-plane GaN substrate of the present invention are facet growth areas each without an inversion domain. Therefore, the C-plane GaN substrate of the present invention has an advantage of being less restricted in terms of the shape and the dimension of a nitride semiconductor device which can be formed on the substrate.

In the C-plane GaN substrate of the present invention, the plurality of facet growth areas observed on the main surface may be at least partially regularly arranged. Such a structure relates to a surface pit generation method used for growing the GaN crystal forming the substrate.

As described above, the GaN crystal forming the C-plane GaN substrate of the present invention is grown on the seed having dot masks provided on the surface thereof. The surface pit is generated one by one over each of the dot masks. Accordingly, when the dot masks are regularly aligned, pits as regularly aligned as the dot masks are generated on the growth surface of GaN.

Such a pit arrangement is reflected on the arrangement of facet growth portions formed in the GaN crystal, further reflected on the arrangement of facet growth areas on the main surface of the C-plane GaN substrate.

Thus, a regular arrangement of facet growth areas which may be observed on the main surface of the C-plane GaN substrate of the present invention is a trace indicating that a seed having dot masks regularly arranged on the surface thereof has been used in growing the GaN crystal forming the substrate.

Accordingly, an area where facet growth areas are arranged in a square lattice may be observed on a main surface of a C-plane GaN substrate comprising a GaN crystal grown by use of a seed having dot masks arranged in a square lattice, and an area where facet growth areas are arranged in a triangle lattice may be observed on a main surface of a C-plane GaN substrate comprising a GaN crystal grown by use of a seed having dot masks arranged in a triangle lattice.

Figure 3A:
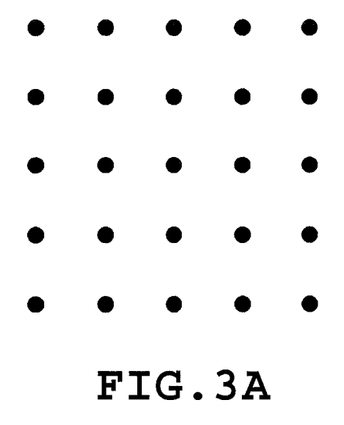
FIGS. 3A and 3B are drawings each illustrating an arrangement example of dot masks, with FIG. 3A and FIG. 3B illustrating a square lattice arrangement and a triangle lattice arrangement, respectively.
Figure 4A:
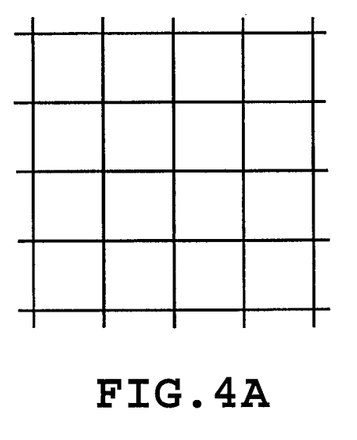
FIGS. 4A and 4B are drawings each illustrating lattice pattern example, with FIG. 4A and FIG. 4B illustrating a square lattice and a triangle lattice, respectively.

The square lattice arrangement here means an arrangement illustrated in FIG. 3A, and dots are arranged on lattice positions of a square lattice. The square lattice here means a lattice pattern where squares having the same sizes are combined, as illustrated in FIG. 4A. The lattice position here means a position where straight lines constituting the lattice pattern intersect with each other.

Figure 3B:
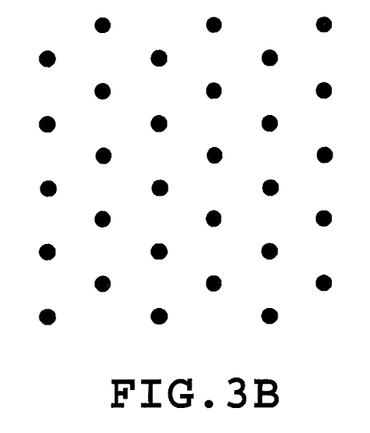
Figure 4B:
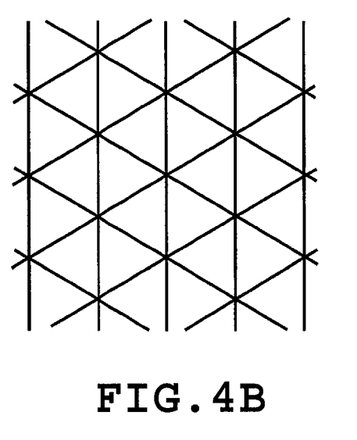

The triangle lattice arrangement here means an arrangement illustrated in FIG. 3B, and dots are arranged on lattice positions of a triangle lattice. The triangle lattice here means a lattice pattern where regular triangles having the same sizes are combined, as illustrated in FIG. 4B.

The dot masks act to generate pits at a very initial stage of crystal growth, and some pits generated may disappear in the course of the subsequent crystal growth or may become larger in size through coalescence with an adjacent pit. Therefore, the facet growth areas observed on the main surface of the C-plane GaN substrate of the present invention are often not fully regularly arranged, but partially regularly arranged. In one example, no regularity may be found in the arrangement of the facet growth areas observed on the main surface of the C-plane GaN substrate of the present invention.

The shape and the arrangement of the facet growth areas on the main surface of the C-plane GaN substrate can be examined by use of, for example, a fluorescence microscope. When visible light observation is performed with a fluorescence microscope, the facet growth areas appear dark and the C-plane growth areas appear bright.

The shape and the arrangement of the facet growth areas can also be seen from a carrier concentration mapping image obtained based on microscopic Raman spectrometry. The carrier concentration tends to become higher from the center towards the outer periphery in each of the facet growth areas. Therefore, in the carrier concentration mapping image, the outline of each facet growth area can be observed in an area where the facet growth areas are in contact with each other.

The facet growth area and the C-plane growth area are slightly different in etching rate, and therefore when a process for finishing the main surface includes CMP or etching, nanoscale steps may be formed between the facet growth area and the C-plane growth area. With respect to a C-plane GaN substrate with such steps formed, the shape and the arrangement of the facet growth areas can be examined from an optical image obtained by use of a differential interference contrast microscope or a semiconductor wafer surface inspection apparatus.

In the C-plane GaN substrate of the present invention, the sum of the areas of all facet growth areas present on the main surface is preferably 70% or more of the area of the main surface. Such a ratio is more preferably 80% or more, still more preferably 90% or more.

The facet growth areas present on the main surface may include not only those derived from the pits generated by the action of the dot masks, but also those derived from pits spontaneously generated without the action of the dot masks.

In the C-plane GaN substrate of the present invention, an oxygen concentration in the facet growth areas may be $5 \times 10^{17}$ cm$^{-3}$ or more, and even $1 \times 10^{18}$ cm$^3$ or more. On the other hand, it is difficult to increase an oxygen concentration in the C-plane growth areas to the order of $10^{17}$ cm$^{-3}$.

The term "oxygen concentration" here means an oxygen concentration measured at a depth of about 1 μm from the surface. Such an oxygen concentration can be measured by Dynamic-SIMS (Secondary Ion Mass Spectroscopy).

Into the C-plane GaN substrate of the present invention, n-type impurities such as silicon (Si) and germanium (Ge) may be added in order to compensate for deficiency of the carrier concentration in the C-plane growth areas. For example, the concentration of silicon in the C-plane growth areas can reach the order of $10^{18}$ cm$^{-3}$.

The electrical resistivity of the C-plane GaN substrate of the present invention is usually 0.1 Ω·cm or less, preferably 0.05 Ω·cm or less, more preferably 0.02 Ω·cm or less. Doing a GaN crystal to an extent such that the electrical resistivity thereof is less than 0.001 Ω·cm may deteriorate the crystallinity and heat conductivity thereof.

The dislocation density on the gallium polar surface of the C-plane GaN substrate can be examined by forming etch pits corresponding to dislocations and counting the number of the etch pits by use of SEM (scanning electron microscope).

The etch pits corresponding to dislocations can be formed by, for example, etching for 2 hours by use of 89% sulfuric acid heated to 270° C. as an etchant.

It is known by those skilled in the art that the type of dislocation can be identified by the size of an etch pit. A large etch pit is derived from a spiral dislocation, and a small etch pit is derived from an edge dislocation. An intermediate-sized etch pit is derived from a mixed dislocation. When the above etching conditions are used, the ratio among the diameters of etch pits derived from a spiral dislocation, a mixed dislocation, and an edge dislocation is approximately 5:2:1.

Accordingly, respective densities of a spiral dislocation, a mixed dislocation, and an edge dislocation can also be determined.

In a C-plane GaN substrate according to a preferable embodiment of the present invention, the spiral dislocation density is less than $1 \times 10^6$ cm$^{-2}$ anywhere on the gallium polar surface. It means that, when the C-plane GaN substrate is etched under the above-described conditions, in any 100 μm-square area selected from the gallium polar surface, the spiral dislocation density (N×$10^4$ cm$^{-2}$) is less than $1 \times 10^6$ cm$^{-2}$ which is obtained by dividing the number (N) of etch pits corresponding to spiral dislocations included in the square area by the area ($10^{-4}$ cm$^2$) of the square area.

In a more preferable embodiment, the spiral dislocation density is less than $8 \times 10^5$ cm$^{-2}$, more preferably less than $5 \times 10^5$ cm$^{-2}$, anywhere on the gallium polar surface.

In the C-plane GaN substrate of the present invention etched under the above-described conditions, when the entire gallium polar surface is comparted into 100 μm-square compartments, the number of the etch pits observed in the individual compartment is less than 1000 usually in more than half of the total compartments. In other words, more than half of the total compartments each have a dislocation density of less than $1 \times 10^7$ cm$^{-2}$.

Additionally, the 100 μm-square compartments usually contains some compartments each having the number of the observed etch pits of more than 1000 and some compartments each having the number of the observed etch pits of less than 100. That is, a high dislocation density part having a dislocation density of more than $1 \times 10^7$ cm$^{-2}$ and a low dislocation density part having a dislocation density of less than $1 \times 10^6$ cm$^{-2}$ may be present on the gallium polar surface of the C-plane GaN substrate of the present invention.

In a preferable example, 1% or more of all the compartments each have the number of the observed etch pits of less than 10, namely, a dislocation density of less than $1\times10^5$ cm$^{-2}$.

A spiral dislocation density of less than $1\times10^6$ cm$^{-2}$ anywhere on the gallium polar surface means that the spiral dislocation density is below $1\times10^6$ cm$^{-2}$ even in a high dislocation density part having a dislocation density of more than $1\times10^7$ cm$^{-2}$.

Since the spiral dislocation density is such a low value even in the high dislocation density part having a locally increased dislocation defect density, a nitride semiconductor device excellent in reliability can be formed on the C-plane GaN substrate of the present invention.

Practically, the C-plane GaN substrate may also be evaluated by a more simplified method. For example, a square area of 1 cm×1 cm on the gallium polar surface is sampled at a rate of one per 4 cm$^2$, and the spiral dislocation density in each square area may be examined.

Figure 9:
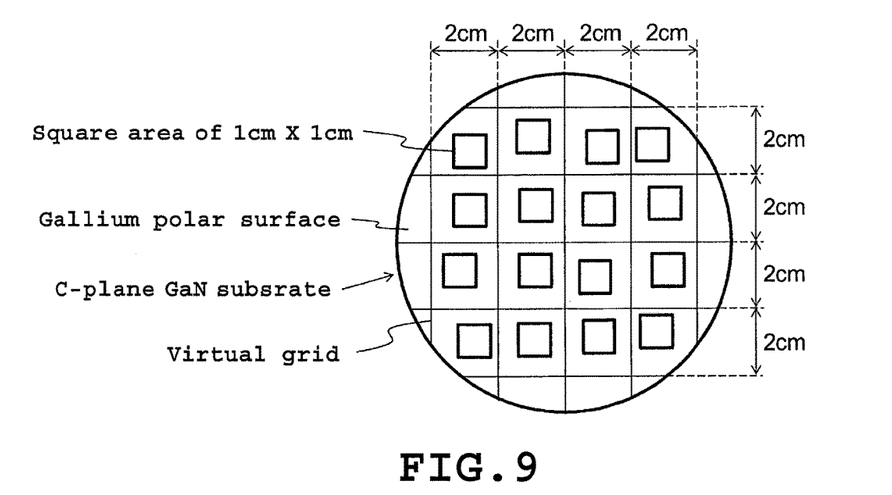
FIG. 9 is a plan view illustrating a virtual grid drawn on a gallium polar surface of a C-plane GaN substrate.

One example is described as follows, with reference to FIG. 9.

(i) A virtual square grid of 2 cm×2 cm is drawn on a gallium polar surface of a C-plane GaN substrate to be evaluated.
(ii) One square area of 1 cm×1 cm is selected from each of the cells on the virtual grid drawn in (i) above. It is noted that sampling may exclude any cell from which no square area of 1 cm×1 cm can be selected without including therein an area distant from the outer periphery of the gallium polar surface by less than 3 mm. In addition, such a square area of 1 cm×1 cm may be selected so as not to include any part obviously seen to be anomalous.
(iii) The spiral dislocation density in each square area selected in (ii) above is examined.

Embodiments of the present invention encompass a C-plane GaN substrate wherein, in all the 1 cm×1 cm square areas thus sampled, the spiral dislocation density is less than $1\times10^6$ cm$^{-2}$ anywhere within the 1 cm×1 cm square area. The spiral dislocation density of such a C-plane GaN substrate can be evaluated to be sufficiently low for practical use, and a nitride semiconductor device excellent in reliability can be formed on the C-plane GaN substrate.

In a preferable embodiment, the spiral dislocation density is less than $8\times10^5$ cm$^{-2}$, and even less than $5\times10^5$ cm$^{-2}$, anywhere within every 1 cm×1 cm square area sampled as above.

2. Method for Producing C-Plane GaN Substrate

A method for producing a C-plane GaN substrate, which may be preferably used for production of the C-plane GaN substrate of the present invention, will be described below.

2.1. Preparation of Seed

A GaN template obtained by growing a c-axis-oriented GaN film on a C-plane sapphire substrate by an MOVPE method is prepared. The dimension (diameter) of the GaN template may be appropriately selected depending on the dimension of a C-plane GaN substrate to be produced.

Next, a selective growth mask is formed on a main surface (GaN film surface) of the GaN template. The material of the selective growth mask may be a material which can inhibit a GaN crystal from starting to grow, and includes, for example, an oxide, nitride or oxynitride of a metal. Preferable examples include silicon oxide, silicon nitride and silicon oxynitride.

The selective growth mask may be formed by forming a thin film made of the above material, having a thickness of 50 to 150 nm, by a method such as plasma CVD, vacuum evaporation, and sputtering, and thereafter patterning the thin film using photolithography and etching technique.

The selective growth mask is formed so as to have a hybrid pattern comprising a first pattern formed with dot masks and a second pattern superposed with the first pattern, which second pattern is a finer pattern than the first pattern.

First, the first pattern will be described.

The dot mask, when having a maximum width of 10 μm, can act to allow a pit to be generated on the surface of the GaN crystal growing on the seed. The maximum width of the dot mask may be 15 μm or more, 30 μm or more, and even 50 μm or more.

The "maximum width of the dot mask" here means the width in a direction in which the width is maximum. For example, the width of a circle is constant regardless of a direction, and therefore the maximum width of a circle is equal to the diameter thereof. The maximum width of a regular polygon having an even number of sides is equal to the diameter of a circumscribed circle thereof.

The shape of the dot mask is, for example, a circle or a regular polygon, but is not limited thereto. The influence of the shape of the dot mask on the shape of a surface pit to be generated thereover is not confirmed. In order to prevent occurrence of anomalous growth, however, a circle or a shape close to a circle (for example, regular hexagon, regular octagon, or regular dodecagon) is preferable.

The maximum width of the dot mask is usually 200 μm or less, preferably 150 μm or less, more preferably 100 μm or less. A too large size of the dot mask causes anomalous growth of the GaN crystal.

The arrangement of the dot masks in the first pattern is preferably a square lattice arrangement illustrated in FIG. 3A or a triangle lattice arrangement illustrated in FIG. 3B, but is not limited thereto.

Figure 5A:
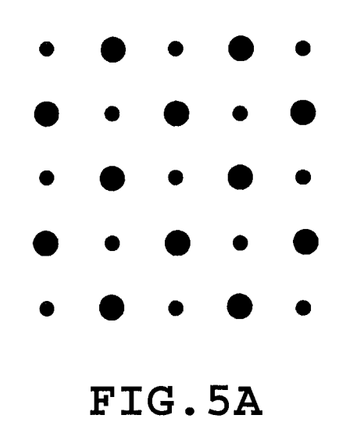
FIGS. 5A and 5B are drawings each illustrating a mode of coexistence of dot masks different in dimension.
Figure 5B:
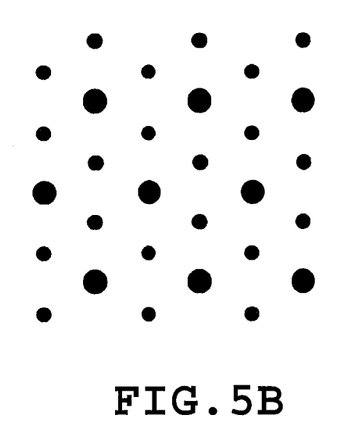

It is not essential that the dimensions of the dot masks are uniform, and, for example, dot masks different in dimension from each other may coexist as illustrated in FIGS. 5A and 5B. In FIG. 5A, two types of dot masks: large and small dot masks; are arranged alternatingly at lattice positions of a square lattice. FIG. 5B illustrates one example of a patter in which dot masks arranged in a triangle lattice include large dot masks and small dot masks.

When the ratio of the area occupied by the dot masks in the selective growth mask is high, and for example, is more than 10%, an anomalousness called a "polytype" easily occurs in the GaN growing on the seed. Accordingly, when the first pattern is designed, it is desirable to adjust the number density of dots so that, while the dimension of the dot mask is in the preferable range mentioned above, the area ratio is 5% or less, 2% or less, and even 1% or less.

For example, when circular dot masks each having a diameter of 100 μm are arranged in a square lattice, the area of one dot mask is $7.85\times10^{-5}$ cm$^2$, and therefore the area ratio of the dot masks is about 2% provided that their number density (=density of lattice positions) is set to 250 cm$^{-2}$. In order that the number density of the dot masks is set to 250 cm$^{-2}$, the interval between the closest lattice positions in a square lattice, namely, the length of one side of a square as a unit lattice may be 632 μm.

Next, the second pattern will be described.

The second pattern is a pattern provided in a blank area (an area where no dot masks are present) of the first pattern, and is a finer pattern than the first pattern, as described above.

Figure 6A:
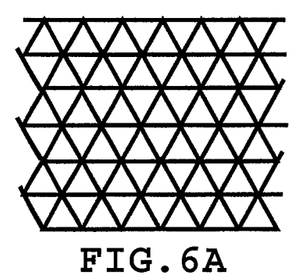
FIGS. 6A to 6E are drawings each illustrating a net pattern example.
Figure 6B:
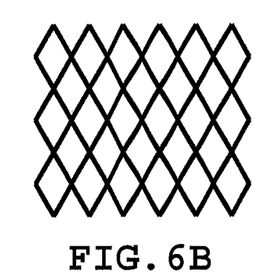
Figure 6C:
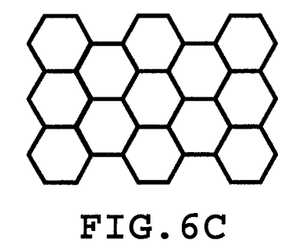
Figure 6D:
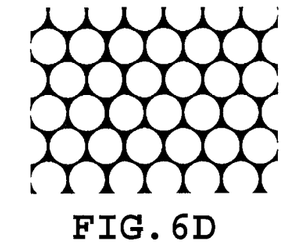
Figure 6E:
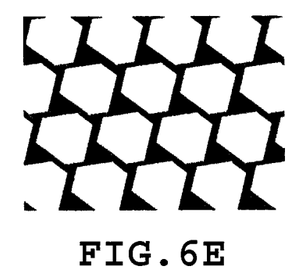

One example of the second pattern is a net pattern. Specific examples of the net pattern are illustrated in FIGS. 6A to 6E. FIG. 6A, FIG. 6B, and FIG. 6C illustrate a triangle lattice net, a rhombus lattice net, and a hexagonal lattice net, respectively. The net pattern in FIG. 6D has circular openings. The net pattern in FIG. 6E has a hexagonal opening of which all the inner angles are each 120° and which is not a regular hexagon.

Figure 7A:
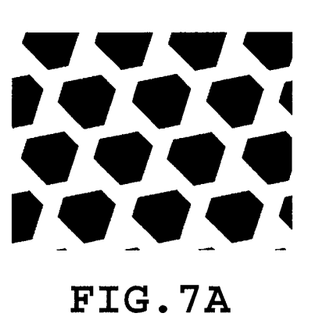
FIGS. 7A to 7C are drawings each illustrating a dot pattern example.
Figure 7B:
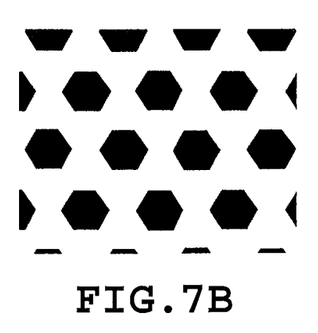
Figure 7C:
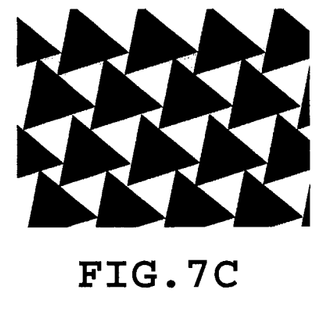

Another example of the second pattern is a dot pattern. Specific examples of the dot pattern are illustrated in FIGS. 7A to 7C. The arrangements of dots in FIGS. 7A to 7C are all triangle lattice arrangements, but the shapes of the dot are different, and the shape in FIG. 7A is a hexagon which is not a regular hexagon, the shape in FIG. 7B is a regular hexagon and the shape in FIG. 7C is a regular triangle. In FIG. 7C, each dot is in point contact with adjacent dots.

Examples of the dot pattern may include not only those illustrated in FIGS. 7 A to 7C, but also a pattern where the arrangement of dots is a hexagon lattice arrangement, and a pattern in which the shape of each dot is a circle, a dodecagon or the like. The combination of the arrangement and the shape of dots is not limited.

Figure 8:
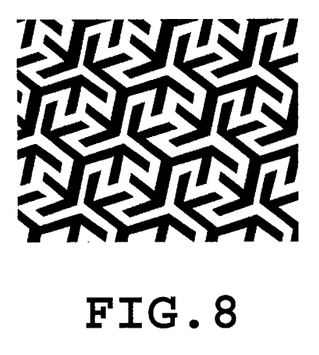
FIG. 8 is a drawing illustrating a complicated pattern.

Furthermore, the second pattern may be a complicated pattern as illustrated in FIG. 8.

The second pattern is a finer pattern than the first pattern. The period of the second pattern is preferably one-tenth or less, further preferably one-fifteenth or less the period of the first pattern.

Furthermore, the period of the second pattern is preferably 30 μm or less, more preferably 20 μm or less, regardless of the period of the first pattern.

The width of the line or dot constituting the second pattern may be one-third or less, one-fifth or less, and even one-tenth or less of the width of the dot mask constituting the first pattern.

Whatever value the width of the dot mask constituting the first pattern is, the width of the line or dot constituting the second pattern is preferably 5 μm or less, more preferably 3 μm or less.

On the other hand, the width of the line or dot constituting the second pattern is usually 0.5 μm or more, preferably 1 μm or more. If the width is too small, not only the cost of photolithography processes is higher, but also the probability of occurrence of defects on the second pattern is higher. The defect which occurs in the second pattern causes anomalous growth of the GaN crystal.

When the second pattern is designed, the period thereof, and the width of the line or dot constituting the pattern are preferably in the above preferable ranges, and the opening ratio (the ratio of the area occupied by the openings in the second pattern) is preferably 50% or less, more preferably 40% or less.

According to the findings by the present inventors, the opening ratio of the second pattern strongly relates to the density of a spiral dislocation generated in a GaN crystal. On the other hand, the densities of an edge dislocation and a mixed dislocation do not so strongly relate to the opening ratio of the second pattern, as compared with the density of a spiral dislocation.

The lower limit of the opening ratio of the second pattern is 20%. If the opening ratio is lower than such a value, an anomalous growth called a polytype easily occurs when the GaN crystal grows on the seed.

2.2. Growth of GaN Crystal

A GaN crystal is grown in the c-axis direction by an HVPE method using, as a seed, the GaN template having the selective growth mask arranged on the main surface prepared in 2.1. above.

As an HVPE apparatus, an apparatus equipped with a hot-wall type quartz reactor may be preferably used. An HCl (hydrochloric acid) gas is supplied to a Ga boat located in the reactor, and HCl is allowed to react with metallic Ga to produce a GaCl gas. The GaCl gas is allowed to react with an $NH_3$ (ammonia) gas separately supplied into the reactor through a piping, and produced GaN is epitaxially grown on a seed located in another place in the reactor.

The growth temperature at the initial stage of growth including the beginning of growth is preferably 980° C. or more, more preferably 985° C. or more. When the growth temperature is low, inversion domain formation becomes easier, and, in particular, when the growth temperature is 970° C. or less, an inversion domain may be formed over every dot mask.

The growth temperature after generation of pits on the growth surface may be set so that the presence of such pits is maintained, and the temperature is preferably 980 to 1100° C., although not limited thereto.

The GaN crystal is usually grown until the distance from the bottom of the pit formed on the growth surface to the surface of the seed reaches 1 mm or more. There is no upper limit of the growth thickness, and the GaN crystal may be grown until the distance reaches 5 mm or more.

When a quartz reactor is used, the grown GaN crystal is doped with oxygen even when an oxygen-containing gas is not intentionally supplied. Oxygen is mainly incorporated into the facet growth portions. Accordingly, the dot masks provided on the surface of the seed can be said to be effective also as a means for uniformly doing the GaN crystal with oxygen. The reason for this is that when the dot masks are arranged evenly on the surface of a seed, pits are evenly generated on the surface of the GaN crystal grown on the dot masks, thereby forming the facet growth portions evenly.

When the oxygen concentration of the GaN crystal is insufficient by only relying on the automatic doing, an oxygen gas ($O_2$) is supplied into the reactor. Conversely, when the oxygen concentration of the GaN crystal is required to be reduced, a liner pipe made of BN (boron nitride), SiC (silicon carbide) or the like is arranged in the reactor and the seed is located inside the pipe to thereby inhibit an oxygen-containing gas generated from the reactor from reaching the seed.

When the GaN crystal is doped with silicon, chlorosilane ($SiH_3Cl$, $SiH_2Cl_2$, $SiHCl_3$, $SiCl_4$) or fluorosilane is preferably supplied as a doing gas into the reactor. When the GaN crystal is doped with germanium, tetrachlorogermane ($GeCl_4$) is preferably supplied as a doing gas into the reactor.

After an elapse of the predetermined growth time, supply of the HCl gas to the Ga boat is stopped and heating of the reactor is also stopped, thereby to stop growth of the GaN crystal and to lower the temperature of the reactor to room temperature.

When the opening ratio of the second pattern of the selective growth mask is 40% or less, the GaN crystal grown tends to be spontaneously separated from the seed during lowering of the seed temperature to room temperature. When the GaN crystal is not spontaneously separated from the seed, a known procedure such as sawing, polishing, laser lift-off or etching is appropriately used for separation.

2.3. Processing of GaN Crystal

When a disk-shaped C-plane GaN substrate is produced, the GaN crystal grown in 2.2 above is subjected to grinding processing or core drilling processing, to produce an ingot having a cylindrical outer circumference. Next, this ingot is sliced parallel to or substantially parallel to the C-plane by use of a wire saw slicer or an inner peripheral blade slicer, to provide a disk-shaped wafer.

Furthermore, either or both main surfaces of the resulting wafer are finished into flat and smooth surface(s) suitable for epitaxially growing a nitride semiconductor thin film thereon.

Both of the gallium polar surface and the nitrogen polar surface may be formed into a surface suitable for epitaxial growth of a nitride semiconductor through planarization by sequentially performing grinding and lapping and thereafter, removal of a damaged layer and smoothing by CMP (Chemical Mechanical Polishing). Processing by RIE (Reactive Ion Etching) may also be performed in addition to CMP or instead of CMP.

It is desirable to also remove a damaged layer from a main surface not to be used for epitaxial growth of a nitride semiconductor. The damaged layer on the nitrogen polar surface can be removed by wet or dry etching. The nitrogen polar surface may be formed into a mat surface by etching.

3. Application of C-Plane GaN Substrate

At least one nitride semiconductor layer may be epitaxially grown on the C-plane GaN substrate of the present invention to provide an epitaxial wafer. In this case, a nitride semiconductor device structure may be formed from the at least one nitride semiconductor layer.

The type of the nitride semiconductor device which may be formed is not limited, and specific examples include light-emitting devices such as a light-emitting diode and a laser diode, electronic devices such as a rectifier, a bipolar transistor, a field-effect transistor and a HEMT (High Electron Mobility Transistor), sensors such as a temperature sensor, a pressure sensor, a radiation sensor, a visible light detector and a ultraviolet light detector, a SAW (Surface Acoustic Wave) device, a transducer, a resonator, an oscillator, MEMS (Micro Electro Mechanical System) components, a voltage actuator, and a solar cell.

The C-plane GaN substrate of the present invention may also be used as a semiconductor electrode in an electrochemical device such as an artificial photosynthesis device.

4. Experimental Results 4.1. Experiment 1

A GaN template was prepared which comprised a C-plane sapphire substrate having a diameter of 76 mm and a c-axis-oriented GaN film having a thickness of about 3 μm epitaxially grown on the substrate by an MOCVD method. The surface of the GaN film was a gallium polar surface.

A $SiN_x$ film having a thickness of 800 Å was deposited on the surface of the GaN film of the GaN template by a plasma CVD method, and thereafter the $SiN_x$ film was patterned by use of conventional photolithography and dry etching technique to form a selective growth mask.

The pattern of the selective growth mask was a hybrid pattern comprising the following first pattern and second pattern superposed each other.

The first pattern was a pattern in which regular hexagon dot masks having a maximum width of 115 μm were arranged in a square lattice. The distance between the closest lattice positions, namely, the length of one side of a square being a unit lattice was 800 μm. Accordingly, the number density of the dot masks was 156 $cm^{-2}$, and the ratio of the area occupied by the dot masks in the selective growth mask was 1.35%.

The second pattern was a triangle lattice net pattern having a line width of 4 μm, and the period thereof was determined so that the opening ratio was 48%.

After formation of the selective growth mask, a GaN crystal was grown on the GaN template by an HVPE method. As the HVPE apparatus, an apparatus equipped with a hot-wall type quartz reactor was used. The outer circumference of the GaN template was covered with a ring, so that only an area with a diameter of 70 mm in a main surface of the GaN template was exposed.

Until 15 minutes after the beginning of epitaxial growth, conditions with a growth temperature of 980° C., a reactor pressure of 101 kPa, an $NH_3$ partial pressure of 10.4 kPa, a GaCl partial pressure of 1.1 kPa, an $H_2$ partial pressure of 65.2 kPa, and an $N_2$ partial pressure of 24.7 kPa were used.

Next, while continuing the supply of the raw material gases and the carrier gases, the growth temperature was raised from 980° C. to 1005° C.

Next, the GaN crystal was grown for 49 hours under conditions with a growth temperature of 1005° C., a reactor pressure of 101 kPa, an $NH_3$ partial pressure of 7.2 kPa, a GaCl partial pressure of 1.1 kPa, an $H_2$ partial pressure of 67.1 kPa, and an $N_2$ partial pressure of 25.6 kPa. Dichlorosilane was supplied as a silicon doing gas into the reactor at this stage.

After the completion of GaN crystal growth, the reactor temperature was lowered to room temperature to take out the GaN crystal grown. The seed was found broken into pieces and adhered to the GaN crystal grown, and therefore they were required to be peeled off by applying a strong force.

The outer circumference of the GaN crystal after peeling off the pieces of the seed was processed into a cylindrical shape and thereafter the GaN crystal was sliced to thereby provide a C-plane wafer having a diameter of 5 cm (2 inches). The damaged layer on the nitrogen polar surface of the C-plane wafer was removed by an alkali etching, and thereafter the gallium polar surface was sequentially subjected to grinding, lapping and CMP, to complete a C-plane GaN substrate.

In the alkali etching, an aqueous KOH solution heated to 80° C. was used as an etchant, and the treatment time was 30 minutes. When the substrate after the etching was observed with SEM, it was found that, while a large number of cones were densely formed on the nitrogen polar surface, no cones were formed on the gallium polar surface at all. It was confirmed from this finding that no inversion domain was present in the C-plane GaN substrate.

Next, the produced C-plane GaN substrate was subjected to various evaluations.

A plurality of facet growth areas each having a closed ring outline-shape were present on the gallium polar surface of the C-plane GaN substrate of Experiment 1, when observed with a fluorescence microscope. The sum of the areas of the facet growth areas was more than 80% of the area of the gallium polar surface.

The oxygen concentration in the facet growth areas reached the order of $10^{18}$ $cm^{-3}$.

The electrical resistivity of the C-plane GaN substrate of Experiment 1 measured by van der Pauw method was between $1\times10^{-2}$ Ω·cm and $2\times10^{-2}$ Ω·cm.

Furthermore, the C-plane GaN substrate of Experiment 1 was etched with 89% sulfuric acid heated to 270° C. as an etchant for 2 hours.

When the gallium polar surface after the etching was observed with SEM, it was found that a part where the number of etch pits observed in a square area of 100 μm×100 μm was more than 1000 and a part where the number of such etch pits was less than 100 were present. The dislocation density of the former part was more than $1\times10^7$ $cm^{-2}$ and the dislocation density of the latter part was less than $1\times10^6$ $cm^{-2}$.

The spiral dislocation density was examined at a part where the dislocation density was more than $1\times10^7$ $cm^{-2}$, and was found to be at most $8\times10^5$ $cm^{-2}$.

4.2. Experiment 2

The same GaN template as that used in Experiment 1 was prepared, and a selective growth mask was formed on the GaN film of the GaN template in the same manner as in Experiment 1. The second pattern of the selective growth mask, however, was changed to a triangle lattice net pattern having a line width of 3 μm and an opening ratio of 39%.

Next, a GaN crystal was grown on the GaN template with the selective growth mask provided on the GaN film, by an HVPE method. The same growth apparatus as in Experiment 1 was used, and the growth conditions were also the same as in Experiment 1.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 5 cm (2 inches). Also in the C-plane GaN substrate of Experiment 2, while a large number of cones were densely formed on the nitrogen polar surface by etching, no cones were observed on the gallium polar surface at all, as in the C-plane GaN substrate of Experiment 1.

When the gallium polar surface of the C-plane GaN substrate of Experiment 2 was observed with a fluorescence microscope, it was found that a plurality of facet growth areas each having a closed ring outline-shape were present. The sum of the areas of the facet growth areas were more than 80% of the area of the gallium polar surface.

When the gallium polar surface of the C-plane GaN substrate of Experiment 2 after etching with 89% sulfuric acid heated to 270° C. as an etchant for 2 hours was observed with SEM, it was found that a part where the number of etch pits observed in a square area of 100 μm×100 μm was more than 1000 and a part where the number of such etch pits was less than 100 were present. The spiral dislocation density was examined at the former part, namely, a part where the dislocation density was more than $1 \times 10^7$ cm$^{-2}$, and was found to be at most $1.4 \times 10^5$ cm$^{-2}$.

4.3. Experiment 3

The same GaN template as that used in Experiment 1 was prepared, and a selective growth mask was formed on the GaN film of the GaN template in the same manner as in Experiment 1. The first pattern and the second pattern of the selective growth mask, however, were changed as follows.

The first pattern was a pattern in which regular hexagon dots each having a maximum width of 23 μm were arranged in a square lattice. The distance between the closest lattice positions, namely, the length of one side of a square being a unit lattice was 200 μm. Accordingly, the number density of the dot masks was 2496 cm$^{-2}$, and the ratio of the area occupied by the dot masks in the selective growth mask was 0.90.

The second pattern was a triangle lattice net pattern having a line width of 3 μm and an opening ratio of 39%, as in Experiment 2.

Next, a GaN crystal was grown on the GaN template with the selective growth mask provided on the GaN film, by an HVPE method. The same growth apparatus as in Experiment 1 was used, and the growth conditions were also the same as in Experiment 1.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 5 cm (2 inches).

Also in the C-plane GaN substrate of Experiment 3, while a large number of cones were densely formed on the nitrogen polar surface by etching, no cones were observed in the gallium polar surface at all, as in the C-plane GaN substrate of Experiment 1.

When the gallium polar surface of the C-plane GaN substrate of Experiment 3 was observed with a fluorescence microscope, it was found that a plurality of facet growth areas each having a closed ring outline-shape were present. The sum of the areas of the facet growth areas were more than 80% of the area of the gallium polar surface.

When the gallium polar surface of the C-plane GaN substrate of Experiment 3 after etching with 89% sulfuric acid heated to 270° C. as an etchant for 2 hours was observed with SEM, it was found that a part where the number of etch pits observed in a square area of 100 μm×100 μm was more than 1000 and a part where the number of such etch pits was less than 100 were present. The spiral dislocation density was examined at the former part, namely, a part where the dislocation density was more than $1 \times 10^7$ cm$^{-2}$, and was found to be at most $2 \times 10^5$ cm$^{-2}$.

4.4. Experiment 4

The same GaN template as that used in Experiment 1 was prepared, and a selective growth mask was formed on the GaN film of the GaN template in the same manner as in Experiment 1. The first pattern and the second pattern of the selective growth mask, however, were changed as follows.

The first pattern was a pattern in which regular hexagon dots each having a maximum width of 35 μm were arranged in a square lattice manner. The distance between the closest lattice positions, namely, the length of one side of a square being a unit lattice was 200 μm. Accordingly, the number density of the dot masks was 2496 cm$^{-2}$, and the ratio of the area occupied by the dot masks in the selective growth mask was 1.9%.

The second pattern was a triangle lattice net pattern having a line width of 3 μm and an opening ratio of 39%, as in Experiment 2.

Next, a GaN crystal was grown on the GaN template with the selective growth mask provided on the GaN film, by an HVPE method. The same growth apparatus as in Experiment 1 was used, and the growth conditions were also the same as in Experiment 1.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 5 cm (2 inches).

Also in the C-plane GaN substrate of Experiment 4, while a large number of cones were densely formed on the nitrogen polar surface by etching, no cones were observed in the gallium polar surface at all, as in the C-plane GaN substrate of Experiment 1.

When the gallium polar surface of the C-plane GaN substrate of Experiment 4 was observed with a fluorescence microscope, it was found that a plurality of facet growth areas each having a closed ring outline-shape were present.

The sum of the areas of the facet growth areas were more than 80% of the area of the gallium polar surface.

When the gallium polar surface of the C-plane GaN substrate of Experiment 4 after etching with 89% sulfuric acid heated to 270° C. as an etchant for 2 hours was observed with SEM, it was found that a part where the number of etch pits observed in a square area of 100 μm×100 μm was more than 1000 and a part where the number of such etch pits was less than 100 were present. The spiral dislocation density was examined at the former part, namely, a part where the dislocation density was more than $1\times10^7$ cm$^{-2}$, and was found to be at most $4\times10^5$ cm$^{-2}$.

4.5. Experiment 5

The same GaN template as that used in Experiment 1 was prepared, and a selective growth mask was formed on the GaN film of the GaN template in the same manner as in Experiment 1. The first pattern and second pattern of the selective growth mask, however, was changed as follows.

The first pattern was a pattern in which regular hexagon dots each having a maximum width of 81 μm were arranged in a square lattice. The distance between the closest lattice positions, namely, the length of one side of a square being a unit lattice was 400 μm. Accordingly, the number density of the dot masks was 624 cm$^{-2}$, and the ratio of the area occupied by the dot masks in the selective growth mask was 2.6%.

The second pattern was a triangle lattice net pattern having a line width of 2.5 μm and an opening ratio of 34%.

Next, a GaN crystal was grown on the GaN template with the selective growth mask provided on the GaN film, by an HVPE method. The same growth apparatus as in Experiment 1 was used, and the growth conditions were also the same as in Experiment 1.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 5 cm (2 inches).

Also in the C-plane GaN substrate of Experiment 5, while a large number of cones were densely formed on the nitrogen polar surface by etching, no cones were observed in the gallium polar surface at all, as in the C-plane GaN substrate of Experiment 1.

When the gallium polar surface of the C-plane GaN substrate of Experiment 5 was observed with a fluorescence microscope, it was found that a plurality of facet growth areas each having a closed ring outline-shape were present. The sum of the areas of the facet growth areas were more than 80% of the area of the gallium polar surface.

When the gallium polar surface of the C-plane GaN substrate of Experiment 5 after etching with 89% sulfuric acid heated to 270° C. as an etchant for 2 hours was observed with SEM, it was found that a part where the number of etch pits observed in a square area of 100 μm×100 μm was more than 1000 and a part where the number of such etch pits was less than 100 were present. The spiral dislocation density was examined at the former part, namely, a part where the dislocation density was more than $1\times10^7$ cm$^{-2}$, and was found to be at most $3\times10^5$ cm$^{-2}$.

4.6. Experiment 6

The same GaN template as that used in Experiment 1 was prepared, and a selective growth mask was formed on the GaN film of the GaN template in the same manner as in Experiment 1. The second pattern of the selective growth mask, however, was omitted.

The first pattern was a pattern in which regular hexagon dots each having a maximum width of 115 μm were arranged in a square lattice manner and the distance between the closest lattice positions, namely, the length of one side of a square being a unit lattice was 800 μm, as in Experiment 1.

The second pattern was omitted, and therefore the selective growth mask had a pattern comprising only dot masks arranged in a square lattice manner.

Next, a GaN crystal was grown on the GaN template with the selective growth mask provided on the GaN film, by an HVPE method. The same growth apparatus as in Experiment 1 was used, and the growth conditions were also the same as in Experiment 1.

The GaN crystal grown was processed in the same manner as in Experiment 1, to provide a C-plane GaN substrate having a diameter of 5 cm (2 inches).

Also in the C-plane GaN substrate of Experiment 6, while a large number of cones were densely formed on the nitrogen polar surface by etching, no cones were observed in the gallium polar surface at all, as in the C-plane GaN substrate of Experiment 1.

When the gallium polar surface of the C-plane GaN substrate of Experiment 6 was observed with a fluorescence microscope, it was found that a plurality of facet growth areas each having a closed ring outline-shape were present. The sum of the areas of the facet growth areas were more than 800 of the area of the gallium polar surface.

When the gallium polar surface of the C-plane GaN substrate of Experiment 6 after etching with 89% sulfuric acid heated to 270° C. as an etchant for 2 hours was observed with SEM, apart where the spiral dislocation density reached $2.8\times10^6$ cm$^{-2}$ was found.

4.7. Experiment 7

The same GaN template as that used in Experiment 1 was prepared, and a selective growth mask was formed on the GaN film of the GaN template in the same manner as in Experiment 1. The second pattern of the selective growth mask, however, was changed to a triangle lattice net pattern having a line width of 2 μm and an opening ratio of 71%.

Next, a GaN crystal was grown on the GaN template with the selective growth mask provided on the GaN film, by an HVPE method. The same growth apparatus as in Experiment 1 was used, and the growth conditions were also the same as in Experiment 1.

After the completion of GaN crystal growth, the reactor temperature was lowered to room temperature to take out the GaN crystal grown. The seed was found to be broken into pieces and adhered to the GaN crystal grown, and therefore was required to be peeled off by applying a strong force.

The GaN crystal after peeling off the pieces of the seed was processed in the same procedure as in Experiment 1, to provide a C-plane GaN substrate having a diameter of 5 cm (2 inches). Also in the C-plane GaN substrate of Experiment 7, while a large number of cones were densely formed on the nitrogen polar surface by etching, no cones were observed on the gallium polar surface at all, as in the C-plane GaN substrate of Experiment 1.

When the gallium polar surface of the C-plane GaN substrate of Experiment 7 was observed with a fluorescence microscope, it was found that a plurality of facet growth areas each having a closed ring outline-shape were present. The sum of the areas of the facet growth areas were more than 80% of the area of the gallium polar surface.

When the gallium polar surface of the C-plane GaN substrate of Experiment 7 after etching with 89% sulfuric acid heated to 270° C. as an etchant for 2 hours was observed with SEM, a part where the spiral dislocation density reached $2\times10^6$ cm$^{-2}$ was found.

Although the present invention is described with reference to specific embodiments as above, the respective embodiments are presented only for illustration and are not intended to limit the scope of the present invention. The embodiments described in the present specification can be variously modified without departing from the gist of the present invention, and each thereof can be combined with any feature described in another embodiment as long as such a combination can be carried out.

REFERENCE SIGNS LIST

10 GaN substrate
11 gallium polar surface
12 nitrogen polar surface
13 side surface

The invention claimed is:

1. A C-plane GaN substrate comprising:
a plurality of facet growth areas each having a closed ring outline-shape on a gallium polar surface, wherein
a spiral dislocation density is less than $1\times10^6$ cm$^{-2}$ anywhere on the gallium polar surface, and
the gallium polar surface is free from any inversion domain.

2. The C-plane GaN substrate according to claim 1, wherein the spiral dislocation density is less than $8\times10^5$ cm$^{-2}$ anywhere on the gallium polar surface.

3. The C-plane GaN substrate according to claim 1, wherein the substrate comprises a high dislocation density part having a dislocation density of more than $1\times10^7$ cm$^{-2}$ and a low dislocation density part having a dislocation density of less than $1\times10^6$ cm$^{-2}$ on the gallium polar surface.

4. The C-plane GaN substrate according to claim 3, wherein, when the entire gallium polar surface is comparted into 100-μm square compartments, 1% or more of all the compartments each have a dislocation density of less than $1\times10^5$ cm$^{-2}$.

5. The C-plane GaN substrate according to claim 1, wherein the substrate is doped with oxygen.

6. The C-plane GaN substrate according to claim 1, wherein the substrate is doped with either or both of silicon and germanium.

7. The C-plane GaN substrate according to claim 1, wherein the substrate has an electrical resistivity of 0.1 Ω·cm or less.

8. The C-plane GaN substrate according to claim 1, wherein the plurality of facet growth areas are at least partially regularly arranged on the main surface.

9. A method for producing a nitride semiconductor device, comprising a step of preparing the C-plane GaN substrate according to claim 1, and a step of epitaxially growing at least one nitride semiconductor layer on the prepared C-plane GaN substrate.

10. A method for producing an epitaxial wafer, comprising a step of preparing the C-plane GaN substrate according to claim 1, and a step of epitaxially growing at least one nitride semiconductor layer on the prepared C-plane GaN substrate.

11. A C-plane GaN substrate having a gallium polar surface, the substrate comprising:
a plurality of facet growth areas each having a closed ring outline-shape on the gallium polar surface, wherein
when a virtual square grid of 2 cm×2 cm is drawn on the gallium polar surface, each cell of the grid comprises at least one 1 cm×1 cm square area in which a spiral dislocation density is anywhere less than $1\times10^6$ cm$^{-2}$, and
the gallium polar surface is free from any inversion domain.

12. The C-plane GaN substrate according to claim 11, wherein each cell of the grid comprises at least one 1 cm×1 cm square area in which a spiral dislocation density is anywhere less than $8\times10^5$ cm$^{-2}$.

13. The C-plane GaN substrate according to claim 11, wherein the substrate comprises a high dislocation density part having a dislocation density of more than $1\times10^7$ cm$^{-2}$ and a low dislocation density area having a dislocation density of less than $1\times10^6$ cm$^{-2}$ on the gallium polar surface.

14. The C-plane GaN substrate according to claim 13, wherein, when the entire gallium polar surface is comparted into compartments of 100 μm-square, 1% or more of all the compartments each have a dislocation density of less than $1\times10^5$ cm$^{-2}$.

15. The C-plane GaN substrate according to claim 11, wherein the substrate is doped with oxygen.

16. The C-plane GaN substrate according to claim 11, wherein the substrate is doped with either or both of silicon and germanium.

17. The C-plane GaN substrate according to claim 11, wherein the substrate has an electrical resistivity of 0.1 Ω·cm or less.

18. The C-plane GaN substrate according to claim 11, wherein the plurality of facet growth areas are at least partially regularly arranged on the main surface.

19. A method for producing a nitride semiconductor device, comprising a step of preparing the C-plane GaN substrate according to claim 11, and a step of epitaxially growing at least one nitride semiconductor layer on the prepared C-plane GaN substrate.

20. A method for producing an epitaxial wafer, comprising a step of preparing the C-plane GaN substrate according to claim 11, and a step of epitaxially growing at least one nitride semiconductor layer on the prepared C-plane GaN substrate.

* * * * *